United States Patent
Louchkoff

(10) Patent No.: US 7,831,197 B2
(45) Date of Patent: Nov. 9, 2010

(54) OUTSIDE UNIT FOR SATELLITE RECEPTION AND METHOD OF RECEPTION WITH SAID UNIT

(75) Inventor: Marc Louchkoff, Aubagne (FR)

(73) Assignee: Thomson Licensing, Boulogne-Billancourt (FR)

( * ) Notice: Subject to any disclaimer, the term of this patent is extended or adjusted under 35 U.S.C. 154(b) by 853 days.

(21) Appl. No.: 10/584,650

(22) PCT Filed: Dec. 15, 2004

(86) PCT No.: PCT/EP2004/053477

§ 371 (c)(1),
(2), (4) Date: May 9, 2007

(87) PCT Pub. No.: WO2005/069495

PCT Pub. Date: Jul. 28, 2005

(65) Prior Publication Data

US 2009/0291655 A1    Nov. 26, 2009

(30) Foreign Application Priority Data

Jan. 6, 2004    (FR) .................................. 04 00070

(51) Int. Cl.
*H04H 20/74*    (2008.01)
*H04B 1/26*    (2006.01)
*H04B 1/10*    (2006.01)
*H04B 1/06*    (2006.01)
*H04B 7/00*    (2006.01)
*H04B 1/18*    (2006.01)
*H04B 17/00*    (2006.01)
*H04B 1/16*    (2006.01)

(52) U.S. Cl. ........................ 455/3.02; 455/324; 455/303; 455/255; 455/257; 455/258; 455/259; 455/265; 455/192.1; 455/192.2; 455/227; 455/334

(58) Field of Classification Search ................. 455/3.02, 455/324, 303, 255, 257–259, 265, 192.1–192.2, 455/227, 334

See application file for complete search history.

(56) References Cited

U.S. PATENT DOCUMENTS 6,577,855 B1 *    6/2003    Moore et al. ................. 455/324

(Continued)

FOREIGN PATENT DOCUMENTS

EP    1198066    4/2002

(Continued)

OTHER PUBLICATIONS

Search Report Dated Jun. 22, 2005.

*Primary Examiner*—Matthew D Anderson
*Assistant Examiner*—Bobbak Safaipour
(74) *Attorney, Agent, or Firm*—Robert D. Shedd; Joseph J. Opalach; Brian J. Cromarty

(57) ABSTRACT

The invention proposes an LNB using two transposition frequencies chosen on either side of the reception band so as to obtain a transposition of supradyne type and a transposition of infradyne type according to the frequency used. This choice of transposition frequencies makes it possible to have an overlap zone in the middle of the reception band which is transposed with the aid of the two oscillation frequencies but at different frequencies. This makes it possible to choose between the two transpositions in the case where the frequency transposed with the aid of an oscillator corresponds to a particularly noisy frequency.

11 Claims, 1 Drawing Sheet

U.S. PATENT DOCUMENTS

Figure 1:
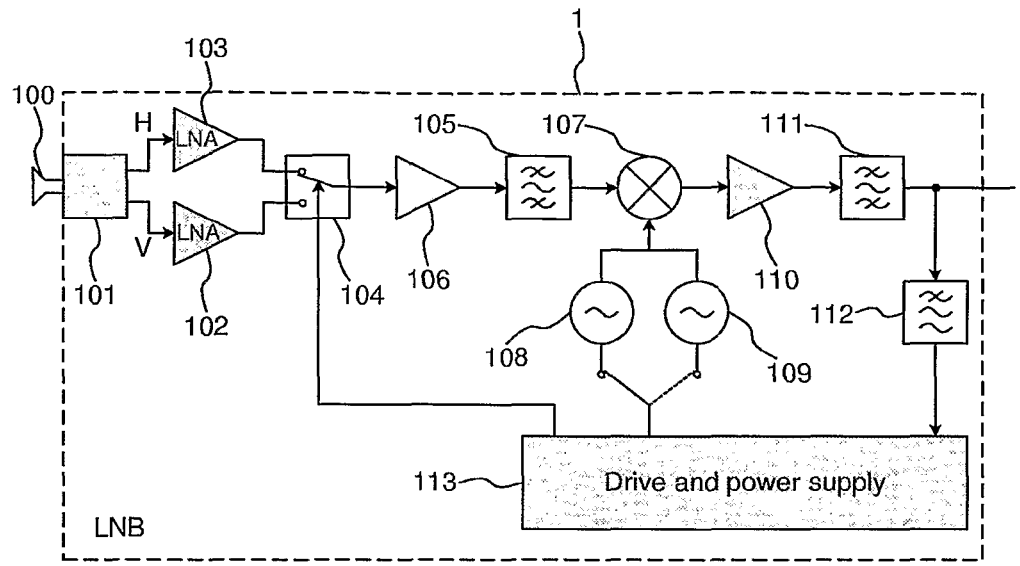

| | | | |
|---|---|---|---|
| 7,039,371 B2 * | 5/2006 | Le Naour et al. | 455/110 |
| 7,274,919 B2 * | 9/2007 | Hirtzlin et al. | 455/188.1 |
| 7,398,062 B2 * | 7/2008 | Mocquard et al. | 455/92 |
| 7,519,342 B2 * | 4/2009 | Ruitenburg | 455/213 |
| 2001/0049271 A1 * | 12/2001 | Hirtzlin et al. | 455/188.1 |
| 2003/0232604 A1 * | 12/2003 | Mocquard et al. | 455/92 |
| 2004/0090364 A1 * | 5/2004 | Le Naour et al. | 342/350 |
| 2005/0243902 A1 * | 11/2005 | Robert et al. | 375/214 |
| 2006/0239384 A1 * | 10/2006 | Le Naour et al. | 375/327 |

FOREIGN PATENT DOCUMENTS

WO    WO 97/23052    6/1997

* cited by examiner

OUTSIDE UNIT FOR SATELLITE RECEPTION AND METHOD OF RECEPTION WITH SAID UNIT

This application claims the benefit, under 35 U.S.C. §365 of International Application PCT/EP04/053477, filed Dec. 15, 2004, which was published in accordance with PCT Article 21(2) on Jul. 28, 2005 in English and which claims the benefit of French patent application No. 0400070, filed Jan. 6, 2004.

The invention pertains to an outside unit for satellite reception and to a method of reception with the said unit. The invention is aimed at improving problems of interference with coexisting communication systems.

Outside units for satellite reception are commonly called LNBs (standing for Low Noise Blocks). The said units are generally placed at the centre of a parabolic reflector which focuses the waves. A unit generally comprises a source which transforms the electromagnetic waves into an electrical signal and then the signals are amplified and transposed to an intermediate frequency band so as to be sent to an inside unit, for example a television programme decoder, by way of a coaxial cable.

For television programme reception, the useful satellite band lies between 10.7 GHz and 12.75 GHz. Outside units are made to receive the whole of this frequency band according to a horizontal polarization and a vertical polarization. The intermediate band used lies between 950 and 2150 MHz. The outside units divide the reception band into four subbands each corresponding to half the satellite band for each of the polarizations. Selection of the band is done for example with the aid of commands sent by the inside unit to the outside unit via the coaxial cable according to the DiSEqC standard.

According to the state of the art, the separation of the satellite band into two subbands is done by using a transposition signal which can take two frequency values which are conventionally 9.75 GHz and 10.6 GHz. With these two transposition frequencies, the part of the satellite band lying between 10.7 and 11.7 GHz gets transposed between 950 and 1950 MHz and the frequency band lying between 11.7 and 12.75 GHz gets transposed between 1100 and 2150 MHz.

Problems of interference with other transmission devices may arise, in particular with wireless digital telephones. The DECT standard provides for the use of a frequency band lying between 1881 and 1898 MHz in Europe and between 1897 and 1914 MHz in the United States. However, this frequency band gets placed in the satellite intermediate band, thereby necessitating appropriate shielding so as not to disturb the reception of the programmes that are transposed to this part of the satellite intermediate band. The problem of shielding is all the greater when the decoder comprises a transmitter/receiver operating in the DECT band so as to be linked to a telephone line via a DECT telephone base or when the decoder itself includes a DECT telephone base. This problem is already identified in American Patent Application US 2002/0052184 A1, and the solution afforded consists in adding in proximity to the LNB a frequency converter which performs an additional transposition of the signal into intermediate band when this signal has to correspond to a frequency situated in the band part subjected to interference. However, such a solution requires additional means at the LNB level and hence extra cost. Moreover, this requires the use of an additional control signal and hence of bandwidth on the linking cable.

The invention proposes to solve the problem of interference by using a less expensive technique which hardly modifies the known structure of an outside unit of LNB type. The invention proposes an LNB using two transposition frequencies chosen on either side of the reception band so as to obtain a transposition of supradyne type and a transposition of infradyne type according to the frequency used. This choice of transposition frequencies makes it possible to have an overlap zone in the middle of the reception band which is transposed with the aid of the two oscillation frequencies but at different frequencies. This makes it possible to choose between the two transpositions in the case where the frequency transposed with the aid of an oscillator corresponds to a particularly noisy frequency.

The invention is an outside unit for receiving waves originating from a satellite, the unit comprising means of amplification and means of transposition using two transposition frequencies to transpose a satellite reception band to an intermediate frequency band of smaller size than the size of the reception band. The two transposition frequencies are such that a part of the satellite reception band is transposed to the intermediate frequency band in an infradyne manner by using one of the transposition frequencies and another part of the satellite reception band is transposed to the intermediate frequency band in a supradyne manner by using the other of the transposition frequencies. The two transposition frequencies are chosen so that there exists an intersection common to the two parts of the band of the satellite reception band which is transposed to the intermediate band with the aid of each of the two oscillators with a spectrum inverted on itself.

The invention is also a method of receiving a radio signal originating from a satellite in a satellite reception band with the aid of an outside unit having means of amplification and means of transposition using two transposition frequencies to transpose a satellite reception band to an intermediate frequency band of smaller size than the size of the reception band. The reception band is separated, for a given polarization, into at least four subbands of increasing frequencies and two adjacent subbands are transposed with the aid of two different transposition frequencies.

Preferably, one of the transposition frequencies is situated at a frequency below the bottom frequency of the satellite reception band from which is subtracted the bottom frequency of the intermediate band. The other of the frequencies is situated at a frequency above the upper frequency of the satellite reception band to which is added the base frequency of the intermediate band. The maximum spacing between the oscillation frequencies is fixed by the width of the reception band to which is added twice the bottom frequency of the intermediate band and to which is also added 81 MHz.

Figure 2:
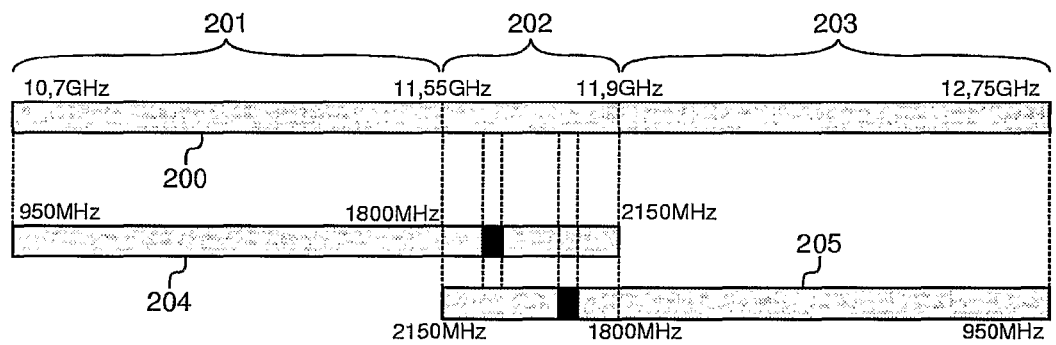
Figure 3:
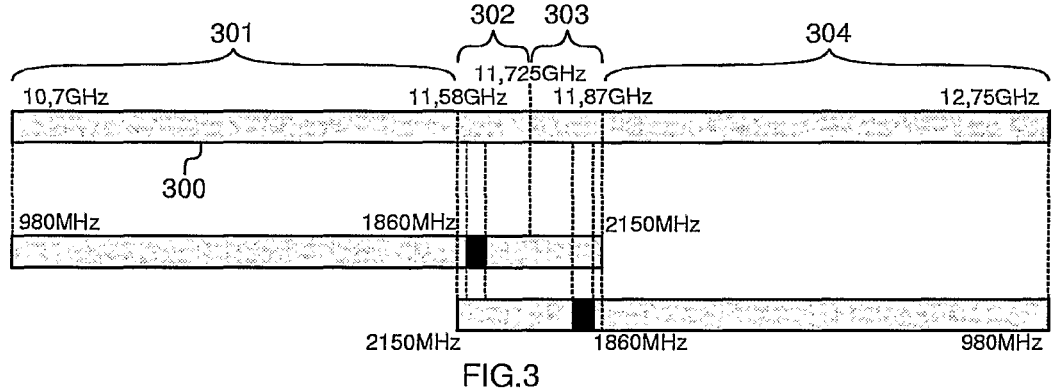

The invention will be better understood and other features and advantages will become apparent on reading the description which follows, the description making reference to the appended drawings in which:

FIG. 1 represents the structure of an LNB in accordance with the present invention, FIG. 2 presents a first example of transposition according to the invention, FIG. 3 presents a second example of transposition according to the invention.

FIG. 1 represents an outside unit 1 (hereinafter called LNB) implementing the invention. The LNB 1 comprises a source 100, for example a horn, which receives the waves originating from the reflection on a parabolic dish (not represented). The waves received by the source 100 are transformed by a transition zone 101 into two electrical signals H and V representative of the waves received respectively under horizontal and vertical polarization. Two low noise amplifiers 102 and 103 respectively amplify each of the electrical signals H and V. A switch 104 selects the output of one of the two low noise amplifiers 102 and 103 so as to supply the signal to transposition means. The transposition means comprise a first bandpass filter 105 coupled to an amplifier 106 so as to amplify the signal selected in the reception band of the LNB 1, for example the band lying between 10.7 GHz and 12.75 GHz. The transposition means comprise a mixer 107 which mixes the signal originating from the first filter 105 with a transposition signal. The transposition signal is supplied in the example described by two oscillators 108 and 109, only one of which is energized so as to have a transposition signal of fixed frequency chosen from among two frequencies. An amplifier 110 coupled to a second bandpass filter 111 amplifies the signal originating from the mixer and selects a passband corresponding to an intermediate frequency band, for example lying between 950 and 2150 MHz, so as to supply a transposed signal in the intermediate band to an input/output terminal of the LNB 1, into which a coaxial cable (not represented) is plugged. The LNB 1 also comprises a lowpass filter 112 linked to the input/output terminal so as to extract the power supply to the LNB and the control signals originating from a distant inside unit (not represented). A drive and power supply circuit 113 is connected to the lowpass filter 112. The drive and power supply circuit provides a voltage to all the elements of the LNB 1, selectively for the oscillators 108 and 109 so that just one operates. The drive and power supply circuit 113 also provides the switch 104 with a control signal so as to select the polarization desired by the inside unit. The control signals sent by the inside unit are for example signals coded according to the DiSEqC standard.

The exemplary embodiment shows two oscillators, only one of which is energized. It is possible to have a single oscillator capable of providing both frequencies as a function of a control signal. It is also possible to have two oscillators operating permanently but whose output is furnished with means of selection making it possible to link just one of the oscillators to the mixer. What is important is to have means of oscillation making it possible to provide a transposition signal of fixed frequency chosen from among two frequencies.

As may be seen by the person skilled in the art, the example described corresponds to a universal LNB and all the structures of a universal LNB are applicable. However, this LNB produced according to the invention makes itself distinguished by the transposition frequencies provided by the oscillators 108 and 109.

The frequencies of the oscillators are chosen on either side of the reception band so as to obtain a transposition of supradyne type and a transposition of infradyne type according to the frequency used. Such a choice leads to having an overlap zone in the middle of the reception band in which the transposed frequencies are not situated at the same frequencies. This makes it possible to choose between the two transpositions in the case where the frequency transposed with the aid of an oscillator corresponds to a particularly noisy frequency.

One condition, for forming a good transposition of the entire reception band, is to have the transposition frequencies spaced apart from the limit frequencies of the reception band by a frequency corresponding to the bottom frequency of the transposition band. FIG. 2 shows an example of transposition carried out with transposition frequencies equal respectively to 9.75 GHz and 13.7 GHz which correspond to the minimum spacing. The reception band 200 lying between 10.7 GHz and 12.75 GHz is separated into first to third subbands 201 to 203, the first subband 201 lying between 10.7 and 11.55 GHz, the second subband 202 lying between 11.55 and 11.9 GHz and the third subband 203 lying between 11.9 and 12.75 GHz. The first and second subbands 201 and 202 are transposed simultaneously and in an infradyne manner to the intermediate band between 950 and 2150 MHz with the aid of the oscillator of frequency 9.75 GHz, this transposition is represented by the band 204. The second and third subbands 202 and 203 are transposed simultaneously and in a supradyne manner to the intermediate band between 950 and 2150 MHz with the aid of the oscillator of frequency 13.7 GHz, this transposition is represented by the band 205. The band is represented in an inverted manner for better comprehension since the effect of the supradyne transposition is to invert the spectrum. The person skilled in the art appreciates that the second subband 202 is transposed with the two oscillators to a portion of the intermediate band which lies between 1800 and 2150 MHz. The inversion of the spectrum poses no problem at the signal demodulation level since the demodulators used for satellite transmission are designed to perform an inversion of the demodulated channel, if necessary. Moreover, it is common to have channels of mutually inverted spectrum.

If one considers the frequency bands used for DECT telephones: Europe uses a band lying between 1881 and 1898 MHz and the United States use a band lying between 1897 and 1914 MHz. The union of these bands corresponds to a DECT band lying between 1881 and 1914 MHz. When an inside unit includes a communication device operating according to the DECT standard, this DECT band corresponds to a band that is very noisy at the level of the inside unit and hence rather unreliable. The DECT band is represented in black on the transposed intermediate bands 204 and 205 and it may be seen that the noisy DECT band for a transposition carried out with an oscillator corresponds to a non-noisy band lying between 2036 and 2069 MHz for the transposition carried out with the aid of the other oscillator.

The limit of splitting of the transposition arises if the transposition frequencies are chosen so as to be spaced too far apart with respect to the reception band. The maximum limit of spacing between the oscillation frequencies is fixed by the width of the reception band, for example 2050 MHz, to which is added twice the bottom frequency of the intermediate band, that is to say twice 950 MHz, and to which is also added the difference, obtained with the example of FIG. 2, between the upper bound of the intermediate band which is 2150 MHz and the transposed upper band of the non-noisy band corresponding to a noisy band, that is to say 2069 MHz, i.e. 81 MHz.

Moreover, on the bottom part of the intermediate band there coexists the GSM band lying between 935 and 960 MHz. This band overlaps the intermediate band on the bottom part lying between 950 and 960 MHz. The GSM band may be disturbing when a GSM base station is situated in proximity to an LNB. Although less troublesome than the DECT band should a DECT apparatus be included in the inside unit, this GSM band may also be eliminated without any problem by shifting the oscillation frequencies.

It is possible to provide a safety margin around the DECT and GSM bands so as to be sure of not encroaching on a channel situated at the limit of the intermediate band. The example of FIG. 3 corresponds to a preferred example which circumvents the DECT and GSM bands while preserving a safety margin. The transposition frequencies are for example fixed at 9.72 GHz and 13.73 GHz. The reception band 300 lying between 10.7 GHz and 12.75 GHz is divided up as in the previous example into three subbands, the first lying between 10.7 and 11.58 GHz, the second lying between 11.55 and 11.87 GHz and the third lying between 11.87 and 12.75 GHz. The first and second subbands are transposed simultaneously and in an infradyne manner to the intermediate band between 980 and 2150 MHz with the aid of the oscillator of frequency 9.72 GHz. The second and third subbands are transposed simultaneously and in a supradyne manner to the intermediate band between 980 and 2150 MHz with the aid of the oscillator of frequency 13.73 GHz. The band is represented in an inverted manner for better comprehension since the effect of the supradyne transposition is to invert the spectrum. The person skilled in the art appreciates that the portion of the intermediate band which lies between 1860 and 2150 MHz and which is transposed with the aid of the two oscillators is of more reduced size but sufficient to circumvent the DECT band as explained previously, the image of the DECT band being located between 2106 MHz and 2129 MHz. The useful spectral width of the intermediate band is also reduced over its bottom part in order to distance it from the GSM band and to circumvent any interference problem related to this band.

The frequency transposition differs from the state of the art without however requiring any significant change at the level of the inside unit. Specifically, the scanning of the satellite band is performed in an alternate manner. With the aid of FIG. 3, the method of transposition will now be detailed. The reception band 300 is divided into first to fourth subbands 301 to 304. The first subband 301 lies between 10.7 and 11.58 GHz, this first subband is transposed with the aid of the 9.72 GHz transposition frequency since there are no other possibilities. The second subband 302 lies between 11.58 and 11.725 GHz, this second subband 302 is transposed with the aid of the 13.73 GHz transposition frequency so as to circumvent problems related to the DECT band which would arise if the 9.72 GHz frequency were used. The third subband 303 lies between 11.725 and 11.87 GHz, this third subband 303 is transposed with the aid of the 9.72 GHZ transposition frequency so as to circumvent problems related to the DECT band which would arise if the 13.73 GHz frequency were used. The fourth subband 304 lies between 11.87 and 12.75 GHz, this fourth subband 304 is transposed with the aid of the 13.73 GHz transposition frequency since there are no other possibilities.

The size of the second and third subbands 302 and 303 may vary since their widths are greater than the bands. It is also possible to make two adjacent subbands overlap slightly so as to be sure that the slicing of the reception band into subbands does not occur exactly in the middle of a transmitted channel.

The person skilled in the art will understand that the separation into four subbands, with the transposition frequencies as defined, corresponds to the minimum separation to be effected in order to circumvent the DECT band.

In the example chosen, the transposition frequencies are chosen symmetrically with respect to the reception band. It is not necessary to have a symmetry such as this. If it is more practical to choose nonsymmetric frequencies, for example for the sake of choosing a cheaper component, this is entirely possible if the conditions stated previously are complied with.

The person skilled in the art will understand that the invention is applicable with regard to each of the polarizations of the LNB as well as with regard to LNBs having only a single polarization.

The invention claimed is:

1. Outside unit for receiving waves originating from a satellite, the unit comprising means of amplification and means of transposition using two transposition frequencies to transpose a satellite reception band to an intermediate frequency band of smaller size than the size of the satellite reception band, wherein the two transposition frequencies are such that a part of the satellite reception band is transposed to the intermediate frequency band in an infradyne manner by using one of the transposition frequencies and another part of the satellite reception band is transposed to the intermediate frequency band in a supradyne manner by using the other of the transposition frequencies, and in that the two transposition frequencies are chosen so that there exists an intersection common to the two parts of the band of the satellite reception band which is transposed to the intermediate frequency band with the aid of each of the two oscillators with a spectrum inverted on itself.

2. Outside unit according to claim 1, wherein one of the transposition frequencies is situated at a frequency below the bottom frequency of the satellite reception band from which is subtracted the bottom frequency of the intermediate frequency band and in that the other of the frequencies is situated at a frequency above the upper frequency of the satellite reception band to which is added the base frequency of the intermediate band.

3. Outside unit according to claim 2, wherein one of the transposition frequencies is equal to 9.75 GHz and the other of the transposition frequencies is equal to 13.7 GHz.

4. Outside unit according to claim 2, wherein the maximum spacing between the oscillation transposition frequencies is fixed by the width of the satellite reception band to which is added twice the bottom frequency of the intermediate frequency band and to which is also added 81 MHz.

5. Outside unit according to claim 4, wherein one of the transposition frequencies is equal to 9.72 GHz and the other of the transposition frequencies is equal to 13.73 GHz.

6. Outside unit according to claim 1, wherein the means of transposition comprises two oscillators which are alternatively supplied so as to have a transposition signal of fixed frequency chosen from among the two transposition frequencies.

7. Method of receiving a radio signal originating from a satellite in a satellite reception band with the aid of an outside unit having means of amplification and means of transposition using two transposition frequencies to transpose a satellite reception band to an intermediate frequency band of smaller size than the size of the satellite reception band, wherein the satellite reception band is separated, for a given polarization, into at least four subbands of increasing frequencies and in that a part of the satellite reception band is transposed to the intermediate frequency band in an infradyne manner by using one of the transposition frequencies and another part of the satellite reception band is transposed to the intermediate frequency band in a supradyne manner by using the other of the transposition frequencies, two adjacent subbands are transposed with the aid of the two different transposition frequencies in an infradyne manner and in a supradyne manner, respectively.

8. Method according to claim 7, wherein one of the transposition frequencies is situated at a frequency below the bottom frequency of the satellite reception band from which is subtracted the bottom frequency of the frequency intermediate band and in that the other of the transposition frequencies is situated at a frequency above the upper frequency of the satellite reception band to which is added the base frequency of the intermediate frequency band.

9. Method according to claim 8, wherein one of the transposition frequencies is equal to 9.75 GHz and the other of the transposition frequencies is equal to 13.7 GHz.

10. Method according to claim 8, wherein the maximum spacing between the oscillation transposition frequencies is fixed by the width of the satellite reception band to which is added twice the bottom frequency of the intermediate frequency band and to which is also added 81 MHz.

11. Method according to claim 10, wherein one of the transposition frequencies is equal to 9.72 GHz and the other of the frequencies is equal to 13.73 GHz.

* * * * *